United States Patent
Kim

(10) Patent No.: US 10,713,191 B2
(45) Date of Patent: Jul. 14, 2020

(54) SEMICONDUCTOR APPARATUS

(71) Applicant: SK hynix Inc., Icheon-si, Gyeonggi-do (KR)

(72) Inventor: Kyung Hoon Kim, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 31 days.

(21) Appl. No.: 15/961,463

(22) Filed: Apr. 24, 2018

(65) Prior Publication Data

US 2019/0163654 A1    May 30, 2019

(30) Foreign Application Priority Data

Nov. 27, 2017   (KR) .......................... 10-2017-0159522

(51) Int. Cl.
| | |
|---|---|
| *G06F 13/40* | (2006.01) |
| *G06F 13/20* | (2006.01) |
| *G06F 13/42* | (2006.01) |
| *G06F 1/32* | (2019.01) |
| *H03K 19/00* | (2006.01) |

(52) U.S. Cl.
CPC ............... *G06F 13/20* (2013.01); *G06F 1/32* (2013.01); *G06F 13/4068* (2013.01); *G06F 13/42* (2013.01); *H03K 19/0016* (2013.01)

(58) Field of Classification Search
USPC .......................................................... 710/32
See application file for complete search history.

(56) References Cited

U.S. PATENT DOCUMENTS

| | | | |
|---|---|---|---|
| 2016/0055802 A1* | 2/2016 | Ahn ..................... | G09G 3/3275 345/691 |
| 2016/0225311 A1* | 8/2016 | Hwang ................ | G09G 3/3208 |
| 2018/0025690 A1* | 1/2018 | Bao ...................... | G09G 3/3225 345/691 |

FOREIGN PATENT DOCUMENTS

| | | |
|---|---|---|
| KR | 1020100060611 A | 6/2010 |
| KR | 1020180026898 A | 3/2018 |

\* cited by examiner

*Primary Examiner* — Ilwoo Park
(74) *Attorney, Agent, or Firm* — William Park & Associates Ltd.

(57) ABSTRACT

A semiconductor apparatus includes first transmitters allocated to a first data byte, and second transmitters allocated to a second data byte, wherein a power supply node of each transmitter allocated to a deactivated byte of the first data byte and the second data byte is coupled with a ground terminal.

11 Claims, 4 Drawing Sheets

SEMICONDUCTOR APPARATUS

CROSS-REFERENCES TO RELATED APPLICATION

The present application claims priority under 35 U.S.C. § 119(a) to Korean application number 10-2017-0159522, filed on Nov. 27, 2017, in the Korean Intellectual Property Office, which is incorporated herein by reference in its entirety.

BACKGROUND

1. Technical Field

Various embodiments generally relate to a semiconductor circuit, and, more particularly, to a semiconductor apparatus capable of converting a data input/output structure.

2. Related Art

Semiconductor apparatuses may be divided into a single die package (SDP) which is configured by one die, and a dual die package (DDP) which is configured by two dies.

Semiconductor apparatuses may operate in various data input/output structures such as X64, X32, X16, and X8 structures which are classified according to the amount or numbers 64, 32, 16, and 8 of data to be inputted/outputted by one command.

Semiconductor apparatuses may be used in such a way as to be converted in data input/output structure as the occasion demands.

That is to say, a semiconductor apparatus which is configured in the X64 structure may be changed to operate in the X32 structure, and in this case, data input/output circuits (DQ) corresponding to data of 4 bytes (32 bits) are not used.

SUMMARY

Various embodiments are directed to a semiconductor apparatus capable of reducing current consumption by the presence of a circuit configuration which does not operate due to a change in data input/output structure.

In an embodiment, a semiconductor apparatus may include: first transmitters allocated to a first data byte; and second transmitters allocated to a second data byte, wherein a power supply node of each transmitter allocated to a deactivated byte of the first data byte and the second data byte is coupled with a ground terminal.

In an embodiment, a semiconductor apparatus may include: first transmitters allocated to a first data byte; second transmitters allocated to a second data byte; and a switching circuit configured to couple a power supply terminal or a ground terminal with a power supply node of each of the second transmitters depending on a control signal.

In an embodiment, a semiconductor apparatus may include: a first die divided into a plurality of channels; and a second die divided into a plurality of channels, wherein each of channels of the first die and the second die includes first transmitters for outputting a first data byte and second transmitters for outputting a second data byte, and wherein a power supply node of each transmitter allocated to a deactivated byte of the first data byte and the second data byte is coupled with a ground terminal.

DETAILED DESCRIPTION

Hereinafter, a semiconductor apparatus will be described below with reference to the accompanying drawings through various example embodiments.

Figure 1:
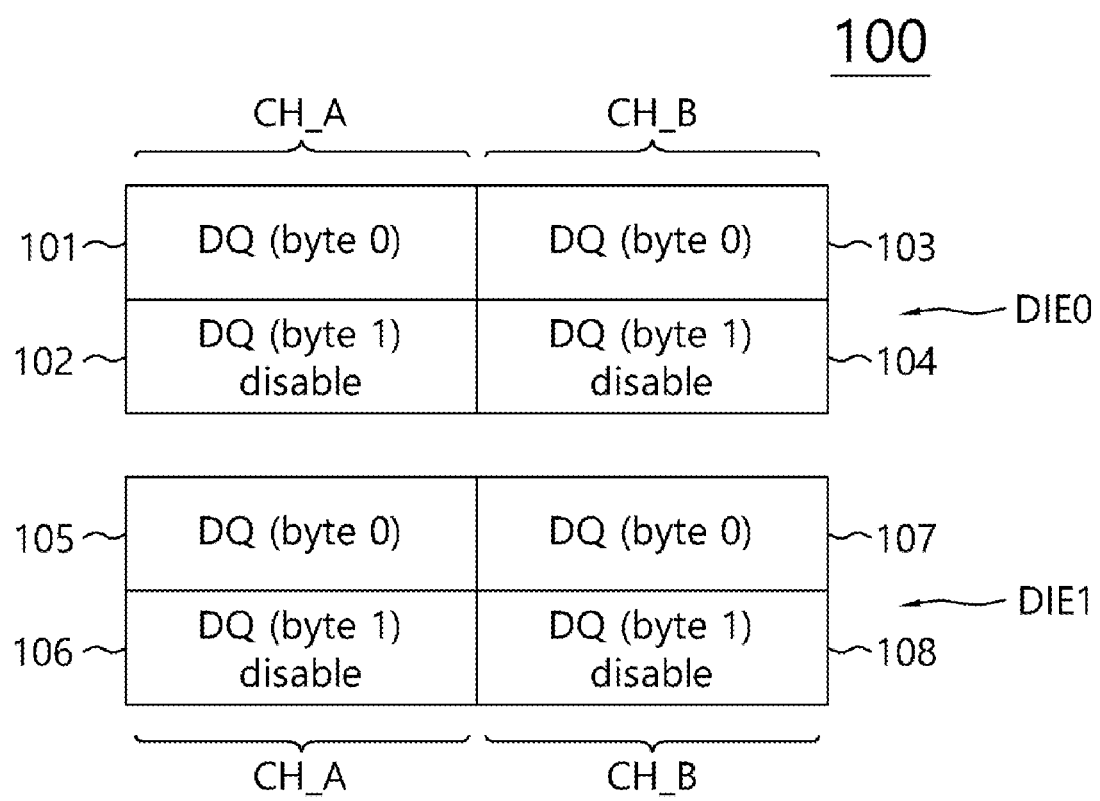
FIG. 1 is a diagram illustrating a representation of an example configuration of a semiconductor apparatus 100 of a dual die package (DDP) type in accordance with an embodiment.

FIG. 1 is a diagram illustrating a representation of an example configuration of a semiconductor apparatus 100 of a dual die package (DDP) type in accordance with an embodiment.

Referring to FIG. 1, the semiconductor apparatus 100 of a dual die package (DDP) type in accordance with an embodiment shows an example in which the semiconductor apparatus 100 is configured to support the X64 structure among the data input/output structures such as X64, X32, X16, and X8 structures, and may include a first die DIE0 and a second die DIE1.

If a read command is inputted, the first die DIE0 may output 4 bytes (32 bits) of data among 8 bytes (64 bits) of data to be outputted according to the X64 structure, and the second die DIE1 may output the remaining 4 bytes. Thus, the data input/output structure may be classified depending on the number of data to be outputted based on a read command.

The first die DIE0 may include a first channel CH_A and a second channel CH_B.

Each of the first channel CH_A and the second channel CH_B may output 2 bytes of data.

The first channel CH_A may include data input/output circuits DQ, that is, a data input/output circuit 101 for outputting a first byte (byte 0) of 2 bytes of data, and a data input/output circuit 102 for outputting the second byte (byte 1) of data.

Also, the second channel CH_B may include a data input/output circuit 103 for outputting a first byte (byte 0) of 2 bytes of data, and a data input/output circuit 104 for outputting the second byte (byte 1) of data.

The second die DIE1 may include a first channel CH_A and a second channel CH_B.

Accordingly, each first channel CH_A may output 2 data bytes, and each second channel CH_B may output 2 data bytes.

The first channel CH_A may include a data input/output circuit 105 for outputting a first byte (byte 0) of 2 bytes of data, and a data input/output circuit 106 for outputting the second byte (byte 1) of data.

Also, the second channel CH_B may include a data input/output circuit 107 for outputting a first byte (byte 0) of 2 bytes of data, and a data input/output circuit 108 for outputting the second byte (byte 1) of data.

Hereafter, for the sake of convenience in explanation, the first bytes (bytes 0) of data will be referred to as activated bytes, and the second bytes (bytes 1) of data will be referred to as deactivated bytes. Deactivated bytes may refer to bytes that are deactivated or bytes are that are designated, classified, or labeled as deactivated.

The activated bytes correspond to 4 bytes of data to be inputted/outputted according to the X32 data input/output structure, among 8 total bytes of data capable of being inputted/outputted by being supported by a semiconductor apparatus, and the deactivated bytes may be 4 bytes of data which do not need to be inputted/outputted according to the X32 data input/output structure, among 8 total data bytes.

The semiconductor apparatus 100 in accordance with an embodiment may convert a data input/output structure from X64 to X32 by deactivating the data input/output circuits 102, 104, 106, and 108 for outputting the deactivated data bytes among the data input/output circuits 101 to 108.

The embodiment shows an example in which the second data bytes (bytes 1) are set as deactivated bytes and the data input/output circuits 102, 104, 106, and 108 for outputting the second data bytes (bytes 1) are deactivated, and a data input/output structure may be converted from X64 to X32 by deactivating the data input/output circuits 101, 103, 105, and 107 for outputting the first data bytes (bytes 0) as deactivated bytes. Accordingly, any one of the first data byte and the second data byte may be deactivated based on the data input output structure.

Figure 2:
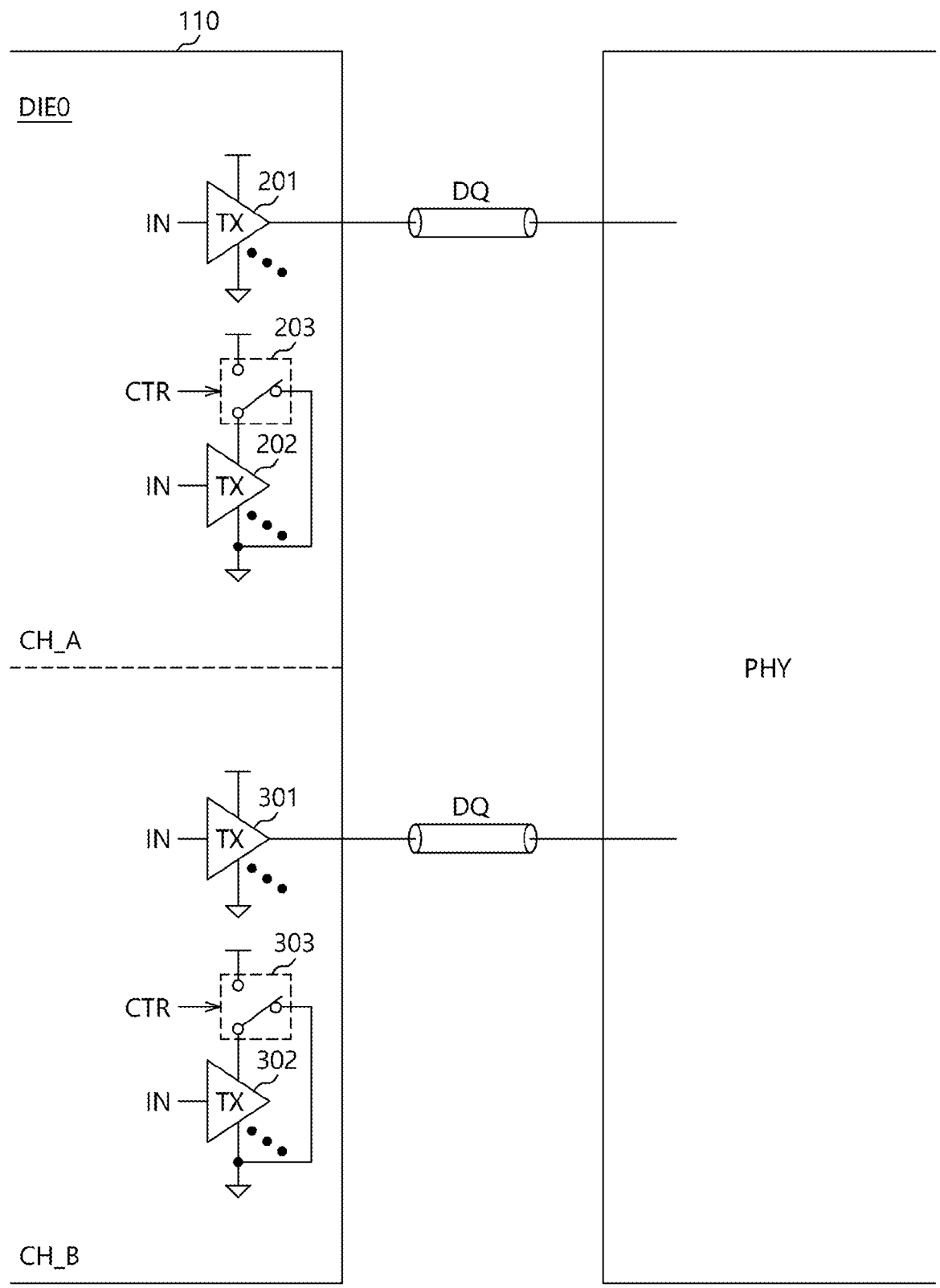
FIG. 2 is a diagram illustrating a representation of an example configuration of a data output circuit 110 of a semiconductor apparatus in accordance with an embodiment.

FIG. 2 is a diagram illustrating a representation of an example configuration of a data output circuit 110 of a semiconductor apparatus in accordance with an embodiment.

FIG. 2 shows only the first die DIE0 of the first die DIE0 and the second die DIE1 for the sake of convenience in illustration. The second die DIE1 may be configured substantially the same as the first die DIE0.

The data output circuit 110 of a semiconductor apparatus in accordance with an embodiment may include first transmitters TX for outputting activated bytes, second transmitters TX for outputting deactivated bytes, and a switching circuit.

The data output circuit 110 may include first transmitters TX for outputting activated bytes, second transmitters TX for outputting deactivated bytes, and a switching circuit, in each of the first channel CH_A and the second channel CH_B.

The first transmitters TX for outputting the first bytes (bytes 0), that is, the activated bytes, described above with reference to FIG. 1 are coupled with a receiving device, for example, a physical layer PHY, through communication lines.

The second transmitters TX for outputting the second bytes (bytes 1), that is, the deactivated bytes, are physically/electrically decoupled from the physical layer PHY. In other words, communication lines are not coupled to the second transmitters TX.

In the second transmitters TX for outputting the deactivated bytes, by coupling a ground terminal to a power supply node (a node to which a power supply terminal is to be coupled), it is possible to prevent leakage current from being generated.

Referring to FIG. 2, first transmitters (TX) 201 allocated or assigned to an activated byte in the first channel CH_A may drive and output data inputted through input terminals IN the first transmitters 201.

The output terminals of the first transmitters 201 are coupled with the physical layer PHY through communication lines.

Second transmitters (TX) 202 allocated to a deactivated byte in the first channel CH_A are physically/electrically decoupled from the physical layer PHY. In other words, communication lines are not coupled to the second transmitters 202.

Data is not provided to input terminals IN of the second transmitters 202.

A switching circuit 203 may couple a power supply terminal (for example, VDDQ) or a ground terminal (for example, VSSQ) with the power supply nodes of the second transmitters 202 depending on a control signal CTR.

For example, the switching circuit 203 may couple the power supply terminal with the power supply nodes of the second transmitters 202 if the control signal CTR is a high level, and may couple the ground terminal with the power supply nodes of the second transmitters 202 if the control signal CTR is a low level. Thus, the switching circuit 203 may couple the ground terminal with the power supply nodes of each of the second transmitters 202 depending on the control signal CTR if the second data byte is deactivated depending on the data input/output structure.

As the switching circuit 203 couples the ground terminal with the power supply nodes of the second transmitters 202, the leakage current emanating from the second transmitters 202 may be prevented.

The control signal CTR may be generated by using a mode register set (MRS), a fuse set, or an option pad.

If the data input/output structure of a corresponding semiconductor apparatus (supporting X64) is set as X64 in the mode register set (MRS), the control signal CTR may be generated at a high level, and, if the data input/output structure is set as X32, the control signal CTR may be generated at a low level. Thus, the control signal CTR may have different values depending on whether or not the second data byte is activated depending on the data input/output structure.

The data input/output structure of a corresponding semiconductor apparatus (supporting X64) may be stored as X64 or X32 in the fuse set, and a stored signal may be used as the control signal CTR.

The option pad is a pad which is provided to select a data input/output structure. For example, because a data input/output structure may be changed depending on whether or not the option pad is grounded, the control signal CTR may be generated if the input/output structure is changed.

First transmitters 301 allocated to an activated byte in the second channel CH_B may drive and output data inputted through input terminals IN of the first transmitters 301.

The output terminals of the first transmitters 301 are coupled with the physical layer PHY through communication lines.

Second transmitters 302 allocated to a deactivated byte in the second channel CH_B are physically/electrically decoupled from the physical layer PHY. In other words, communication lines are not coupled to the second transmitters 302.

Data is not provided to input terminals IN of the second transmitters 302.

A switching circuit 303 may couple the power supply terminal or the ground terminal with the power supply nodes of the second transmitters 302 depending on the control signal CTR.

For example, the switching circuit 303 may couple the power supply terminal with the power supply nodes of the second transmitters 302 if the control signal CTR is a high level, and may couple the ground terminal with the power supply nodes of the second transmitters 302 if the control signal CTR is a low level. Thus, the switching circuit 303 may couple the ground terminal with the power supply nodes of each of the second transmitters 302 depending on the control signal CTR if the second data byte may be deactivated depending on the data input/output structure.

As the switching circuit 303 couples the ground terminal with the power supply nodes of the second transmitters 302, the leakage current emanating from the second transmitters 302 may be prevented.

Because the second die DIE1 may be configured the same as the first die DIE0, descriptions for configuration of the second die DIE1 will be omitted herein.

Figure 3:
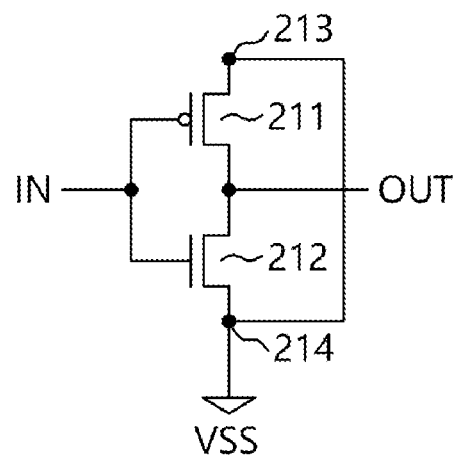
FIG. 3 is a diagram illustrating a representation of an example configuration of the transmitter 202 shown in FIG. 2.

FIG. 3 is a diagram illustrating a representation of an example configuration of the second transmitter 202 shown in FIG. 2.

Referring to FIG. 3, the second transmitter 202 may include first and second transistors 211 and 212.

Gates of the first and second transistors 211 and 212 may be coupled with the input terminal IN.

Not the power supply terminal but the ground terminal is coupled to a power supply node 213 of the second transmitter 202, that is, the source terminal of the first transistor 211.

The drain terminal of the first transistor 211 may be coupled with the drain terminal of the second transistor 212.

A ground node 214 of the second transmitter 202, that is, the source terminal of the second transistor 212 is coupled with the ground terminal.

An output node OUT to which the drain terminal of the first transistor 211 and the drain terminal of the second transistor 212 are coupled is floated.

Because a potential difference is not generated when the ground terminal is coupled to the source terminal of the first transistor 211, the leakage current emanating from the second transmitter 202 may be prevented.

Figure 4:
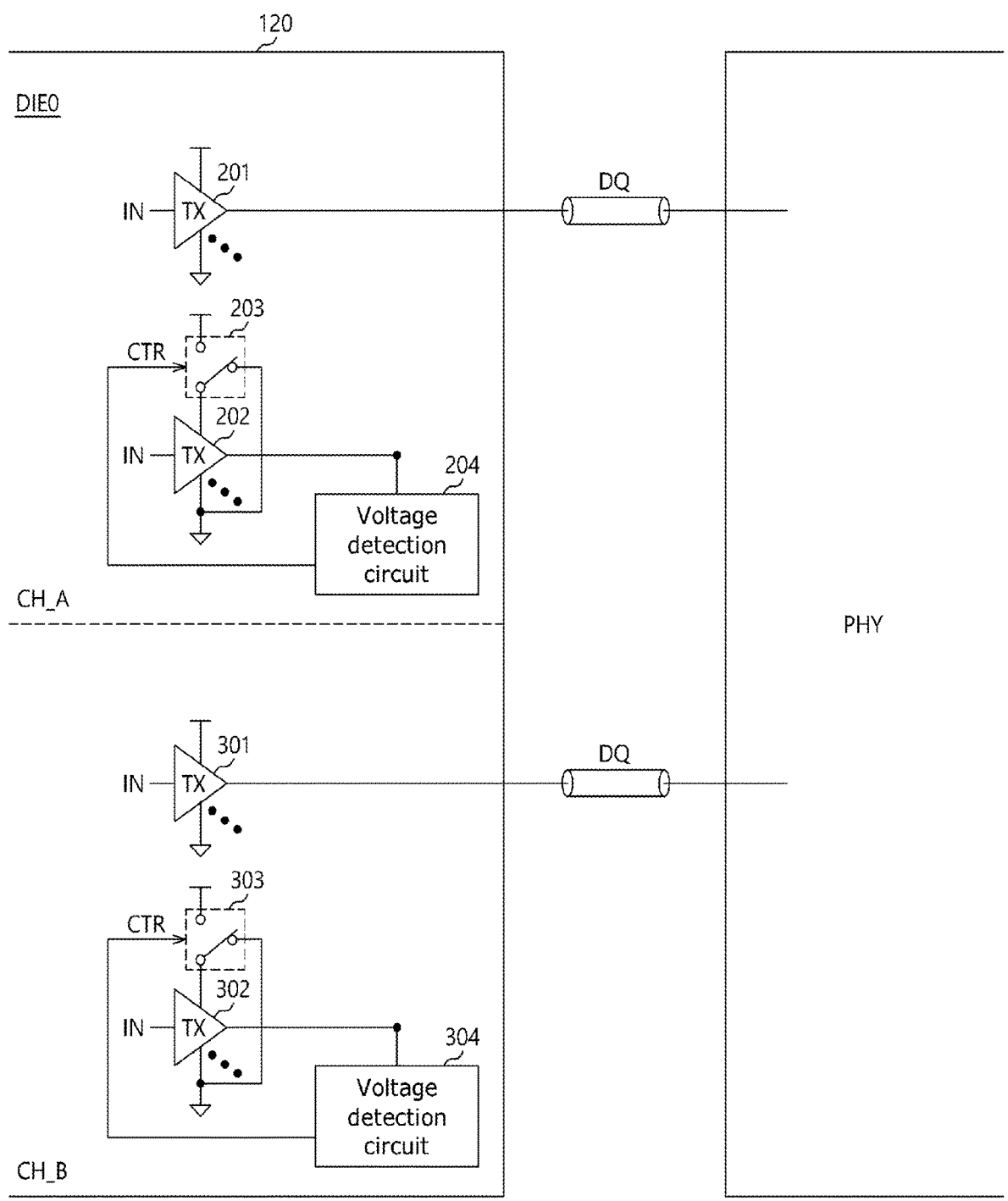
FIG. 4 is a diagram illustrating a representation of an example configuration of a data output circuit 120 of a semiconductor apparatus in accordance with another embodiment.

FIG. 4 is a diagram illustrating a representation of an example configuration of a data output circuit 120 of a semiconductor apparatus in accordance with another embodiment.

FIG. 4 shows only the first die DIE0 of the first die DIE0 and the second die DIE1 for the sake of convenience in illustration. The second die DIE1 may be configured substantially the same as the first die DIE0.

The data output circuit 120 of a semiconductor apparatus in accordance with an embodiment may include first transmitters TX allocated to activated bytes, second transmitters TX allocated to deactivated bytes, a switching circuit, and a voltage detection circuit.

The data output circuit 120 may include first transmitters TX allocated to activated bytes, second transmitters TX allocated to deactivated bytes, a switching circuit, and a voltage detection circuit, in each of the first channel CH_A and the second channel CH_B.

The first transmitters TX are coupled with a receiving device, for example, a physical layer PHY, through communication lines.

The second transmitters TX are physically/electrically decoupled from the physical layer PHY. In other words, communication lines are not coupled to the second transmitters TX.

In the second transmitters TX, by coupling a ground terminal to a power supply node (a node to which a power supply terminal is to be coupled), it is possible to prevent leakage current from being generated.

Referring to FIG. 4, first transmitters (TX) 201 allocated to an activated byte in the first channel CH_A may drive and output data inputted through input terminals IN of the first transmitters 201.

The output terminals of the first transmitters 201 are coupled with the physical layer PHY through communication lines.

Second transmitters (TX) 202 allocated to a deactivated byte in the first channel CH_A are physically/electrically decoupled from the physical layer PHY. In other words, communication lines are not coupled to the second transmitters 202.

Data is not provided to input terminals IN of the second transmitters 202.

A switching circuit 203 may couple a power supply terminal (for example, VDDQ) or a ground terminal (for example, VSSQ) with the power supply nodes of the second transmitters 202 depending on a control signal CTR.

For example, the switching circuit 203 may couple the power supply terminal with the power supply nodes of the second transmitters 202 if the control signal CTR is a high level, and may couple the ground terminal with the power supply nodes of the second transmitters 202 if the control signal CTR is a low level.

As the switching circuit 203 couples the ground terminal with the power supply nodes of the second transmitters 202, the leakage current emanating from the second transmitters 202 may be prevented.

A voltage detection circuit 204 may generate the control signal CTR depending on a result of detecting voltages of the output nodes of the second transmitters 202.

If the second transmitters 202 are deactivated, the output nodes of the second transmitters 202 are floated. In other words, output nodes of the second transmitters 202 may be floated when the second data byte is deactivated. Therefore, the voltage detection circuit 204 may generate the control signal CTR at a low level if the voltages of the output nodes of the second transmitters 202 are voltages based on the floating state, and may generate the control signal CTR at a high level if the voltages of the output nodes of the second transmitters 202 are not the voltages based on the floating state.

First transmitters 301 allocated to an activated byte in the second channel CH_B may drive and output data inputted through input terminals IN of the first transmitters 301.

The output terminals of the first transmitters 301 are coupled with the physical layer PHY through communication lines.

Second transmitters 302 allocated to a deactivated byte in the second channel CH_B are physically/electrically decoupled from the physical layer PHY. In other words, communication lines are not coupled to the second transmitters 302.

Data is not provided to input terminals IN of the second transmitters 302.

A switching circuit 303 may couple the power supply terminal or the ground terminal with the power supply nodes of the second transmitters 302 depending on the control signal CTR.

For example, the switching circuit 303 may couple the power supply terminal with the power supply nodes of the second transmitters 302 if the control signal CTR is a high level, and may couple the ground terminal with the power supply nodes of the second transmitters 302 if the control signal CTR is a low level.

As the switching circuit 303 couples the ground terminal with the power supply nodes of the second transmitters 302, the leakage current emanating from the second transmitters 302 may be prevented.

A voltage detection circuit 304 may generate the control signal CTR depending on a result of detecting voltages of the output nodes of the second transmitters 302.

If the second transmitters 302 are deactivated, the output nodes of the second transmitters 302 are floated. In other words, output nodes of the second transmitters 302 may be floated when the second data byte is deactivated. Therefore, the voltage detection circuit 304 may generate the control signal CTR at a low level if the voltages of the output nodes of the second transmitters 302 are voltages based on the floating state, and may generate the control signal CTR at the high level if the voltages of the output nodes of the second transmitters 302 are not the voltages based on the floating state.

Because the second die DIE1 may be configured substantially the same as the first die DIE0, descriptions for configuration of the second die DIE1 will be omitted herein.

While various embodiments have been described above, it will be understood to those skilled in the art that the embodiments described are examples only. Accordingly, the semiconductor apparatus described herein should not be limited based on the described embodiments.

What is claimed is:

1. A semiconductor apparatus comprising:
   first transmitters allocated to a first data byte;
   second transmitters allocated to a second data byte;
   a switching circuit configured to couple a ground terminal with a power supply node of each of the second transmitters when a control signal has a first value, and couple a power supply terminal with the power supply node of each of the second transmitters when the control signal has a second value, and
   a voltage detection circuit configured to generate the control signal depending on a result of detecting voltages of the output nodes of the second transmitters.

2. The semiconductor apparatus according to claim 1, wherein output nodes of the second transmitters are floated if the second data byte is deactivated.

3. The semiconductor apparatus according to claim 1, wherein the control signal has different values depending on whether or not the second data byte is activated depending on a data input/output structure.

4. The semiconductor apparatus according to claim 1, wherein the switching circuit is configured to couple the ground terminal with the power supply node of each of the second transmitters depending on the control signal, if the second data byte is deactivated depending on the data input/output structure.

5. The semiconductor apparatus according to claim 4, wherein the data input/output structure is classified depending on the number of data to be outputted according to one command.

6. The semiconductor apparatus according to claim 1, wherein the control signal is generated by using a mode register set, a fuse set or an option pad.

7. A semiconductor apparatus comprising:
   a first die divided into a plurality of channels;
   a second die divided into a plurality of channels,
   wherein each of channels of the first die and the second die includes first transmitters for outputting a first data byte and second transmitters for outputting a second data byte,
   a switching circuit configured to couple power supply nodes of the first transmitters and the second transmitters with a power supply terminal or a ground terminal depending on a control signal; and
   a voltage detection circuit configured to generate the control signal depending on a result of detecting voltages of the output nodes of the second transmitters.

8. The semiconductor apparatus according to claim 7, wherein any one of the first data byte and the second data byte is deactivated according to a data input/output structure.

9. The semiconductor apparatus according to claim 8, wherein the data input/output structure is classified depending on the number of data to be outputted according to one read command.

10. The semiconductor apparatus according to claim 7, wherein output nodes of the second transmitters are floated if the second data byte is deactivated.

11. The semiconductor apparatus according to claim 7, wherein the control signal is generated by using a mode register set, a fuse set, or an option pad.

* * * * *